(12) United States Patent
Yoshikawa et al.

(10) Patent No.: US 10,388,854 B2
(45) Date of Patent: Aug. 20, 2019

(54) MAGNETIC MEMORY DEVICE

(71) Applicant: TOSHIBA MEMORY CORPORATION, Minato-ku, Tokyo (JP)

(72) Inventors: Masatoshi Yoshikawa, Seoul (KR); Shuichi Tsubata, Seoul (KR)

(73) Assignee: TOSHIBA MEMORY CORPORATION, Tokyo (JP)

(*) Notice: Subject to any disclaimer, the term of this patent is extended or adjusted under 35 U.S.C. 154(b) by 0 days.

(21) Appl. No.: 15/918,820

(22) Filed: Mar. 12, 2018

(65) Prior Publication Data

US 2019/0088856 A1 Mar. 21, 2019

(30) Foreign Application Priority Data

Sep. 20, 2017 (JP) ................. 2017-180698

(51) Int. Cl.
| | |
|---|---|
| *H01L 43/02* | (2006.01) |
| *H01L 43/08* | (2006.01) |
| *H01L 43/10* | (2006.01) |
| *H01L 43/12* | (2006.01) |
| *H01L 27/22* | (2006.01) |

(52) U.S. Cl.
CPC .......... *H01L 43/02* (2013.01); *H01L 43/08* (2013.01); *H01L 43/10* (2013.01); *H01L 43/12* (2013.01); *H01L 27/228* (2013.01)

(58) Field of Classification Search
CPC ......... H01L 43/00; H01L 43/02; H01L 43/08; H01L 43/10; H01L 43/12
See application file for complete search history.

(56) References Cited

U.S. PATENT DOCUMENTS

| | | | |
|---|---|---|---|
| 9,502,056 B1* | 11/2016 | Kojima | .................... G11B 5/39 |
| 9,620,562 B2 | 4/2017 | Katine | |
| 9,691,458 B2 | 6/2017 | Ralph et al. | |
| 2002/0048128 A1* | 4/2002 | Kamiguchi | ............ B82Y 10/00 360/324.1 |
| 2012/0023386 A1* | 1/2012 | Oh | .......................... H01L 43/08 714/769 |
| 2015/0048464 A1* | 2/2015 | Park | ..................... G11C 11/161 257/421 |
| 2015/0200003 A1 | 7/2015 | Buhrman et al. | |
| 2016/0079519 A1 | 3/2016 | Yoshikawa et al. | |
| 2017/0033281 A1 | 2/2017 | Hu | |
| 2017/0069365 A1 | 3/2017 | Buhrman et al. | |

OTHER PUBLICATIONS

Wang Kang et al., "High-Speed, Low-Power, Magnetic Non-Volatile Flip-Flop With Voltage-Controlled, Magnetic Anisotropy Assistance", IEEE Magnetics Letters (vol. 7) Aug. 30, 2016.

* cited by examiner

*Primary Examiner* — Victoria K. Hall
(74) *Attorney, Agent, or Firm* — Holtz, Holtz & Volek PC

(57) ABSTRACT

According to one embodiment, a magnetic memory device includes a stacked structure, the stacked structure including a first magnetic layer having a variable magnetization direction, a second magnetic layer having a fixed magnetization direction and a nonmagnetic layer provided between the first magnetic layer and the second magnetic layer, wherein the nonmagnetic layer comprises a structure in which a first oxide layer formed of a first metal oxide and a second oxide layer formed of a second metal oxide having a relative dielectric constant greater than a relative dielectric constant of the first metal oxide are stacked.

6 Claims, 11 Drawing Sheets

MAGNETIC MEMORY DEVICE

CROSS-REFERENCE TO RELATED APPLICATIONS

This application is based upon and claims the benefit of priority from Japanese Patent Application No. 2017-180698, filed Sep. 20, 2017, the entire contents of which are incorporated herein by reference.

FIELD

Embodiments described herein relate generally to a magnetic memory device.

BACKGROUND

A magnetic memory device (semiconductor integrated circuit device) in which a magnetoresistive element and a MOS transistor are integrated on a semiconductor substrate has been suggested.

One of the important objects of the above magnetoresistive element is to reduce write current.

However, in conventional magnetoresistive elements, the reduction in write current is not necessarily sufficient.

DETAILED DESCRIPTION

In general, according to one embodiment, a magnetic memory device includes a stacked structure, the stacked structure including a first magnetic layer having a variable magnetization direction, a second magnetic layer having a fixed magnetization direction and a nonmagnetic layer provided between the first magnetic layer and the second magnetic layer, wherein the nonmagnetic layer comprises a structure in which a first oxide layer formed of a first metal oxide and a second oxide layer formed of a second metal oxide having a relative dielectric constant greater than a relative dielectric constant of the first metal oxide are stacked.

Embodiments will be described hereinafter with reference to the accompanying drawings.

Embodiment 1

Figure 1:
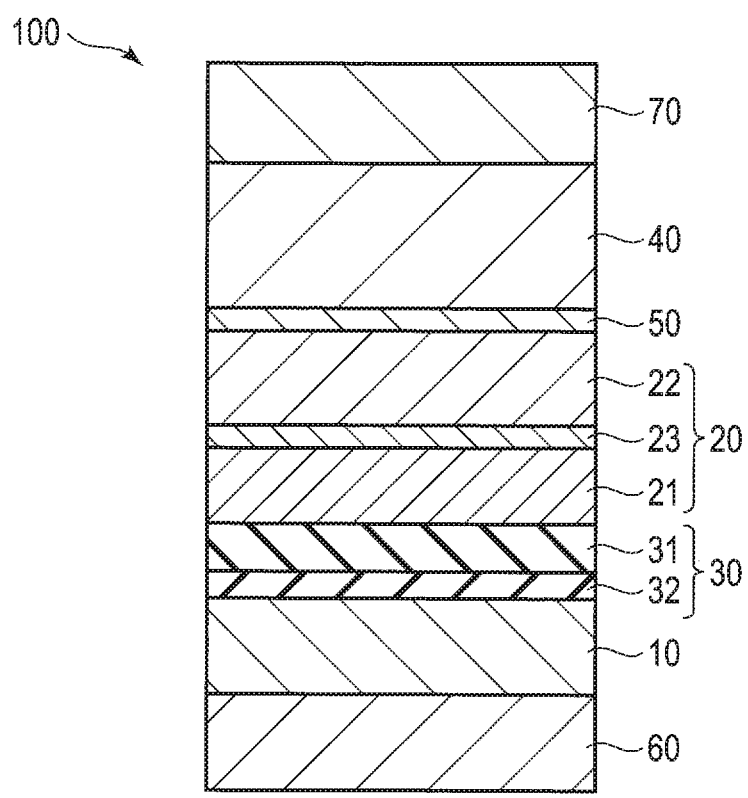
FIG. 1 is a cross-sectional view schematically showing the structure of a magnetic memory device according to a first embodiment.

FIG. 1 is cross-sectional view schematically showing the structure of a magnetic memory device (semiconductor integrated circuit device) according to a first embodiment. The magnetic memory device of the present embodiment includes a magnetoresistive element. The magnetoresistive element is also called a magnetic tunnel junction (MTJ) element.

As shown in FIG. 1, a stacked structure 100 is provided on a lower region (not shown). The lower region includes a semiconductor substrate, a MOS transistor provided on the semiconductor substrate, an interconnection, an interlayer insulating film, etc. The stacked structure 100 functions as a magnetoresistive element, and includes a storage layer 10 as a first magnetic layer, a reference layer 20 as a second magnetic layer, a tunnel barrier layer 30 as a nonmagnetic layer, a shift canceling layer 40 as a third magnetic layer, an intermediate layer 50, an under layer 60 and a cap layer 70.

The storage layer (first magnetic layer) 10 is a ferromagnetic layer having a variable magnetization direction, and contains at least one of iron (Fe) and cobalt (Co). The storage layer 10 may contain boron (B) in addition to at least one of iron (Fe) and cobalt (Co). In the present embodiment, the storage layer 10 is formed of CoFeB.

The reference layer (second magnetic layer) 20 is a ferromagnetic layer having a fixed magnetization direction. The reference layer 20 includes a first sub-magnetic layer 21, a second sub-magnetic layer 22, and an intermediate layer 23 provided between the first sub-magnetic layer 21 and the second sub-magnetic layer 22. The first sub-magnetic layer 21 contains at least one of iron (Fe) and cobalt (Co). The first sub-magnetic layer 21 may contain boron (B) in addition to at least one of iron (Fe) and cobalt (Co). In the present embodiment, the first sub-magnetic layer 21 is formed of CoFeB. The second sub-magnetic layer 22 contains cobalt (Co) and at least one element selected from platinum (Pt), nickel (Ni) and palladium (Pd). In the present embodiment, the second sub-magnetic layer 22 is formed of a super lattice of Co/Pt, Co/Ni or Co/Pd. The intermediate layer 23 is interposed between the first sub-magnetic layer 21 and the second sub-magnetic layer 22, and is formed of, for example, tantalum (Ta). Tungsten (W) or molybdenum (Mo) may be used as the intermediate layer 23.

Magnetization of the first sub-magnetic layer 21 and magnetization of the second sub-magnetic layer 22 are coupled so as to be parallel to each other. That is, they are coupled ferromagnetically.

The magnetization direction is variable means that the magnetization direction changes for a predetermined write current. The magnetization direction is fixed means that the magnetization direction does not change for a predetermined write current.

The tunnel barrier layer (nonmagnetic layer) 30 is an insulating layer provided between the storage layer 10 and the reference layer 20. The tunnel barrier layer 30 comprises a structure in which a first oxide layer 31 and a second oxide layer 32 are stacked. The first oxide layer 31 is formed of a first metal oxide. Magnesium oxide (MgO) is used for the first metal oxide. The second oxide layer 32 is formed of a second metal oxide having a relative dielectric constant greater than that of the first metal oxide. The second metal oxide is selected from calcium oxide (CaO), strontium oxide (SrO), hafnium oxide ($HfO_2$), titanium oxide (TiO, $TiO_2$), lanthanum oxide ($La_2O_3$), tantalum oxide ($TaO_2$), europium oxide (EuO), copper oxide (CuO), barium oxide (BaO), vanadium oxide (VO), nickel oxide (NiO), cobalt oxide (CoO), manganese oxide (MnO), chromium oxide (CrO) and iron oxide (FeO). The tunnel barrier layer 30 is explained in detail later.

The shift canceling layer (third magnetic layer) 40 is a ferromagnetic layer having a fixed magnetization direction. The magnetization direction of the shift canceling layer 40 is antiparallel to the magnetization direction of the reference layer 20. Thus, the shift canceling layer 40 has a function for canceling the magnetic field applied from the reference layer 20 to the storage layer 10. The shift canceling layer 40 contains cobalt (Co) and at least one element selected from platinum (Pt), nickel (Ni) and palladium (Pd). In the present embodiment, the shift canceling layer 30 is formed of a super lattice of Co/Pt, Co/Ni or Co/Pd.

The intermediate layer 50 is interposed between the reference layer 20 and the shift canceling layer 40, and includes a layer formed of, for example, ruthenium (Ru). Iridium (Ir), rhodium (Rh) or osmium (Os) may be used as the intermediate layer 50. When a thickness of the intermediate layer 50 is about 1.5 nm or less, magnetization of the shift canceling layer 40 and magnetization of the reference layer 20 are coupled antiparallel. That is, they are adjusted so as to be coupled antiferromagnetically.

The under layer 60 is provided under the storage layer 10. A bottom electrode (not shown) is connected to the under layer 60.

The cap layer 70 is provided on the shift canceling layer 40. A top electrode (not shown) is connected to the cap layer 70.

The magnetoresistive element obtained by the stacked structure 100 is a spin-transfer-torque (STT) magnetoresistive element having perpendicular magnetization. All of the storage layer 21, the reference layer 22 and the shift canceling layer 40 have a magnetization direction perpendicular to the respective main surfaces.

The resistance of the stacked structure 100 for the magnetoresistive element when the magnetization direction of the storage layer 10 is parallel to the magnetization direction of the reference layer 20 is less than that when the magnetization direction of the storage layer 10 is antiparallel to the magnetization direction of the reference layer 20. In other words, when the magnetization direction of the storage layer 10 is parallel to the magnetization direction of the reference layer 20, the stacked structure 100 is in a low resistive state. When the magnetization direction of the storage layer 10 is antiparallel to the magnetization direction of the reference layer 20, the stacked structure 100 is in a high resistive state. Thus, the magnetoresistive element is capable of storing binary data (0 or 1) based on the resistive state (the low resistive state or the high resistive state). The resistive state of the magnetoresistive element can be set based on the direction of write current flowing in the magnetoresistive element (stacked structure 100). Specifically, by supplying write current from the storage layer 10 to the reference layer 20, the magnetization direction of the storage layer 10 is set parallel to the magnetization direction of the reference layer 20. By supplying write current from the reference layer 20 to the storage layer 10, the magnetization direction of the storage layer 10 is set antiparallel to the magnetization direction of the reference layer 20.

As described above, the tunnel barrier layer 30 of the present embodiment comprises a structure in which the first oxide layer 31 formed of the first metal oxide and the second oxide layer 32 formed of the second metal oxide having a relative dielectric constant greater than that of the first metal oxide are stacked. As the tunnel barrier layer 30 of the present embodiment has this structure, it is possible to reduce write current by the voltage-control of magnetic anisotropy (VCMA) effect. Additional explanation is provided below.

Figure 2:
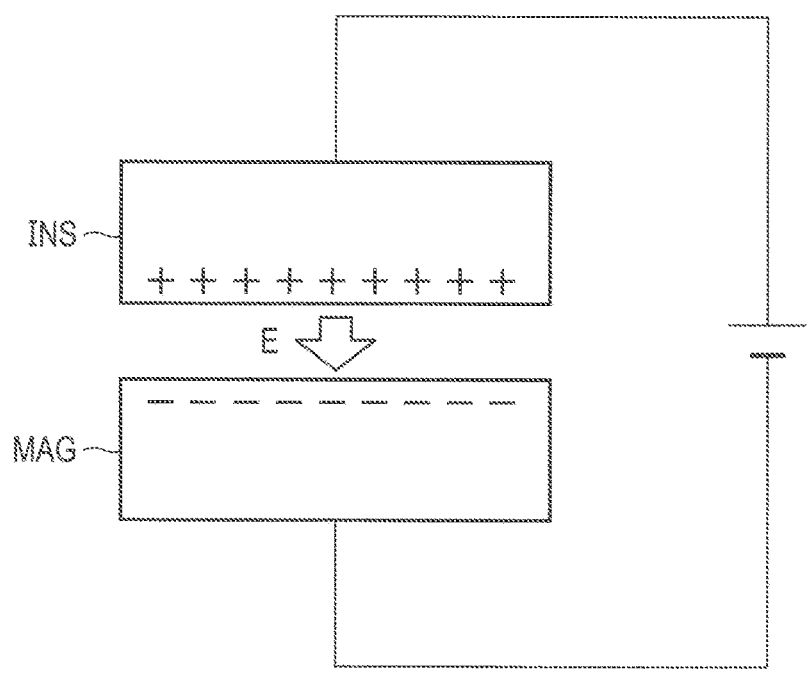
FIG. 2 shows the VCMA effect.
Figure 3:
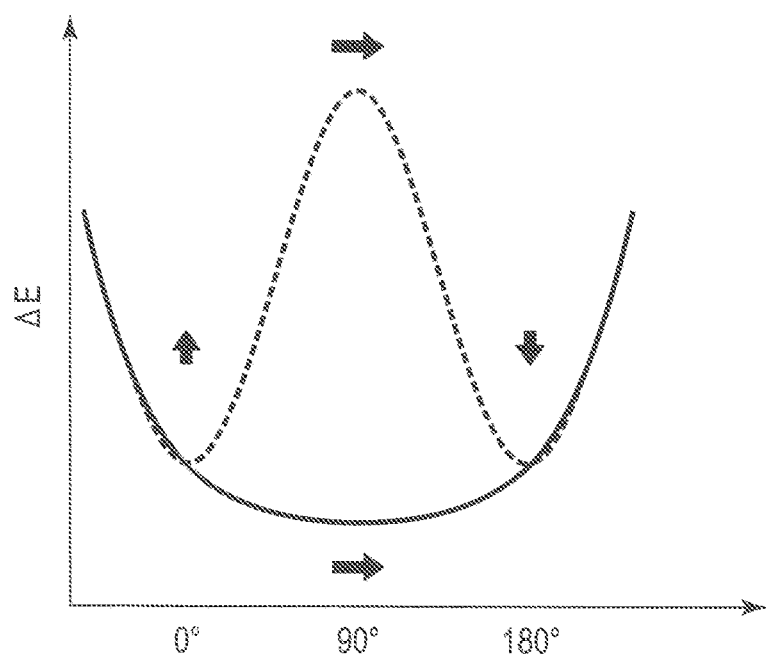
FIG. 3 shows magnetization reversal based on the VCMA effect.

FIG. 2 shows the VCMA effect. FIG. 3 shows magnetization reversal based on the VCMA effect.

As shown in FIG. 2, when a magnetic material layer MAG and an insulating material layer INS are stacked, and further when positive voltage is applied to the insulating material layer INS side relative to the magnetic material layer MAG, positive charge is induced on the insulating material layer INS side, and negative charge is induced on the magnetic material layer MAG side. In this way, an electric field E is applied from the insulating material layer INS to the magnetic material layer MAG. At this time, the state of d electrons having the orbit component of the magnetic material layer MAG near the interface between the insulating material layer INS and the magnetic material layer MAG is changed. As a result, although the magnetic material layer MAG has only perpendicular magnetic anisotropy when no voltage is applied, in-plane magnetic anisotropy is imparted when voltage is applied. When in-plane magnetic anisotropy is imparted to the magnetic material layer MAG in addition to perpendicular magnetic anisotropy, as shown in FIG. 3, the energy barrier for magnetic reversal is decreased, and thus, the magnetization of the magnetic material layer MAG can be easily reversed.

As described above, when the magnetic material layer MAG and the insulating material layer INS are stacked, and further when positive voltage is applied to the insulating material layer INS side, the energy barrier for magnetization reversal can be decreased by the VCMA effect. In the present embodiment, write current is reduced by using the above VCMA effect.

Figure 4:
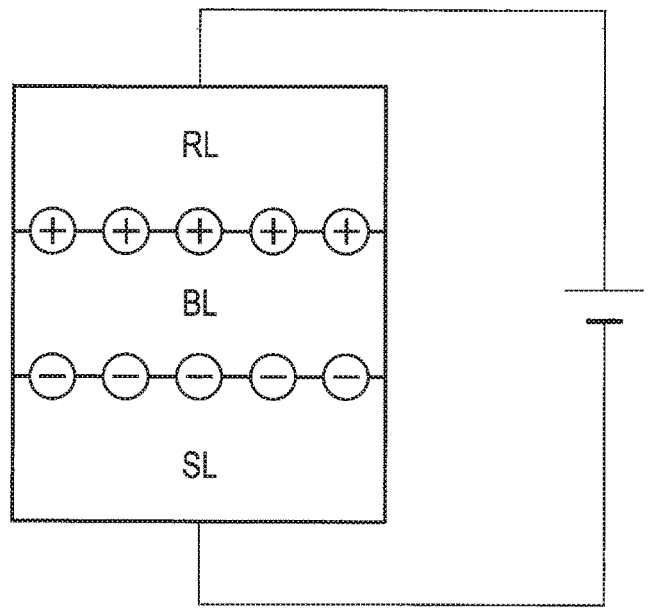
FIG. 4 schematically shows a state when positive voltage is applied to the reference layer side relative to a storage layer.

FIG. 4 schematically shows a state when positive voltage is applied to the reference layer RL side relative to a storage layer SL. In this case, negative charge (electron) is induced at the interface between the storage layer SL and a tunnel barrier layer BL, and positive charge (hole) is induced at the interface between the reference layer RL and the tunnel barrier layer BL. As a result, the above VCMA effect is caused to the storage layer SL, and thus, the magnetization of the storage layer SL is easily reversed. In other words, it is possible to reduce write current when current is supplied from the reference layer RL to the storage layer SL.

Figure 5:
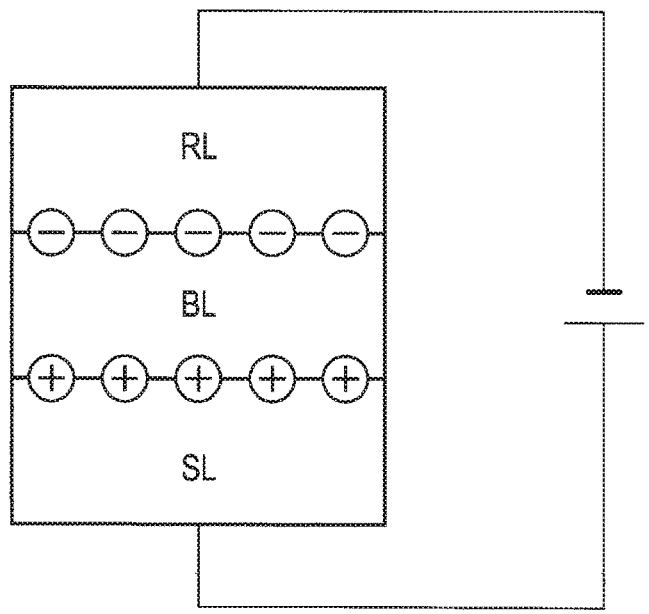
FIG. 5 schematically shows a state when negative voltage is applied to the reference layer side relative to the storage layer.

FIG. 5 schematically shows a state when negative voltage is applied to the reference layer RL side relative to the storage layer SL. In this case, positive charge is induced at the interface between the storage layer SL and the tunnel barrier layer BL, and negative charge is induced at the interface between the reference layer RL and the tunnel barrier layer BL. Thus, the VCMA effect is not caused to the storage layer SL. In this way, when current is supplied from the storage layer SL to the reference layer RL, write current is not reduced.

The case of FIG. 4, specifically, a case where current is supplied from the reference layer RL to the storage layer SL is a case where the magnetization direction of the storage layer SL relative to the reference layer RL is set antiparallel. Thus, when the magnetization direction of the storage layer SL relative to the reference layer RL is changed from parallel to antiparallel, it is possible to reduce write current based on the VCMA effect.

To reduce write current based on the VCMA effect, the selection of a suitable tunnel barrier layer is important. A structure for obtaining a suitable tunnel barrier layer is explained below.

In FIG. 1, to obtain a large VCMA effect, it is preferable that a large amount of charge be induced at the interface between the storage layer 10 and the tunnel barrier layer 30 and the interface between the reference layer 20 and the tunnel barrier layer 30. A phenomenon in which charge is induced at the both end faces of the above insulating material layer INS by applying voltage to the insulating material layer INS is called a dielectric phenomenon. The ratio of a dielectric phenomenon is called a relative dielectric constant. Thus, to increase the charge induction of the insulating material layer INS, the tunnel barrier layer 30 preferably has a high relative dielectric constant. In general, in many cases, magnesium oxide (MgO) is used for the first metal oxide of the first oxide layer 31. Thus, a metal oxide having a relative dielectric constant greater than that of the first metal oxide (magnesium oxide [MgO]) is preferably used for the second metal oxide of the second oxide layer 32. To obtain the tunnel barrier layer 30 having excellent crystallinity, the crystalline structure of the second metal oxide is preferably as similar to the crystalline structure of the first metal oxide as possible. When magnesium oxide (MgO) is used for the first metal oxide, the second metal oxide preferably has an NaCl crystalline structure as MgO has an NaCl crystalline structure. MgO preferentially orients a (001) face.

In consideration of the above factors, when magnesium oxide (MgO) is used for the first metal oxide, the following metal oxides are preferably used for the second metal oxide.

The most suitable candidates (first candidates) for the second metal oxide are calcium oxide (CaO) and strontium oxide (SrO). Both CaO and SrO have a high relative dielectric constant, and have an NaCl crystalline structure. Further, Ca and Sr are the elements of the same group as Mg. Thus, the first candidates for the second metal oxide are CaO and SrO. When the second metal oxide is stacked together with MgO, which preferentially orients a (001) face, CaO and SrO having the same NaCl crystalline structure are desirable as they also easily and preferentially orient a (001) face. Thus, it is possible to bring about the VCMA effect without impairing a high TMR ratio (>100%) caused by the $\Delta 1$ band unique to MgO preferentially orienting a (001) face.

The second candidates for the second metal oxide are hafnium oxide ($HfO_2$), titanium oxide ($TiO_2$), lanthanum oxide ($La_2O_3$) and tantalum oxide ($TaO_2$). These metal oxides also have a high relative dielectric constant. However, these metal oxides do not have an NaCl crystalline structure (they have a crystalline structure of a hexagonal system). It should be noted that diffuse scattering TMR is exhibited. Further, low resistance can be realized. Thus, the above metal oxides are the second candidates for the second metal oxide.

The third candidates for the second metal oxide are europium oxide (EuO), titanium oxide (TiO), copper oxide (CuO) and barium oxide (BaO). These metal oxides have a high relative dielectric constant, and have an NaCl crystalline structure. The priority order of these metal oxides is lower than that of the first and second candidates. However, the $\Delta 1$ band of MgO is not impaired, and the degradation of MR is expected to be small. Thus, the above metal oxides are the third candidates for the second metal oxide.

The fourth candidates for the second metal oxides are vanadium oxide (VO), nickel oxide (NiO), cobalt oxide (CoO), manganese oxide (MnO), chromium oxide (CrO) and iron oxide (FeO). These metal oxides have a high relative dielectric constant, and have an NaCl crystalline structure. However, these metal oxides may have antiferromagnetism. Thus, the MR may be decreased, and inverse MR may be caused. For this reason, these metal oxides are the fourth candidates for the second metal oxide.

A thickness of the second metal oxide layer described above is preferably 2 nm or less. The second metal oxide layer may be a noncontinuous film, and may be discretely formed.

As described above, the tunnel barrier layer 30 of the present embodiment comprises a structure in which the first oxide layer 31 formed of the first metal oxide and the second oxide layer 32 formed of the second metal oxide having a relative dielectric constant greater than that of the first metal oxide are stacked. In this way, it is possible to decrease write current by the VCMA effect and obtain a magnetoresistive element having excellent characteristics. In particular, when magnesium oxide (MgO) is used for the first metal oxide, a magnetoresistive element having excellent characteristics can be obtained by using the second metal oxide selected from the first to fourth candidates.

Figure 6:
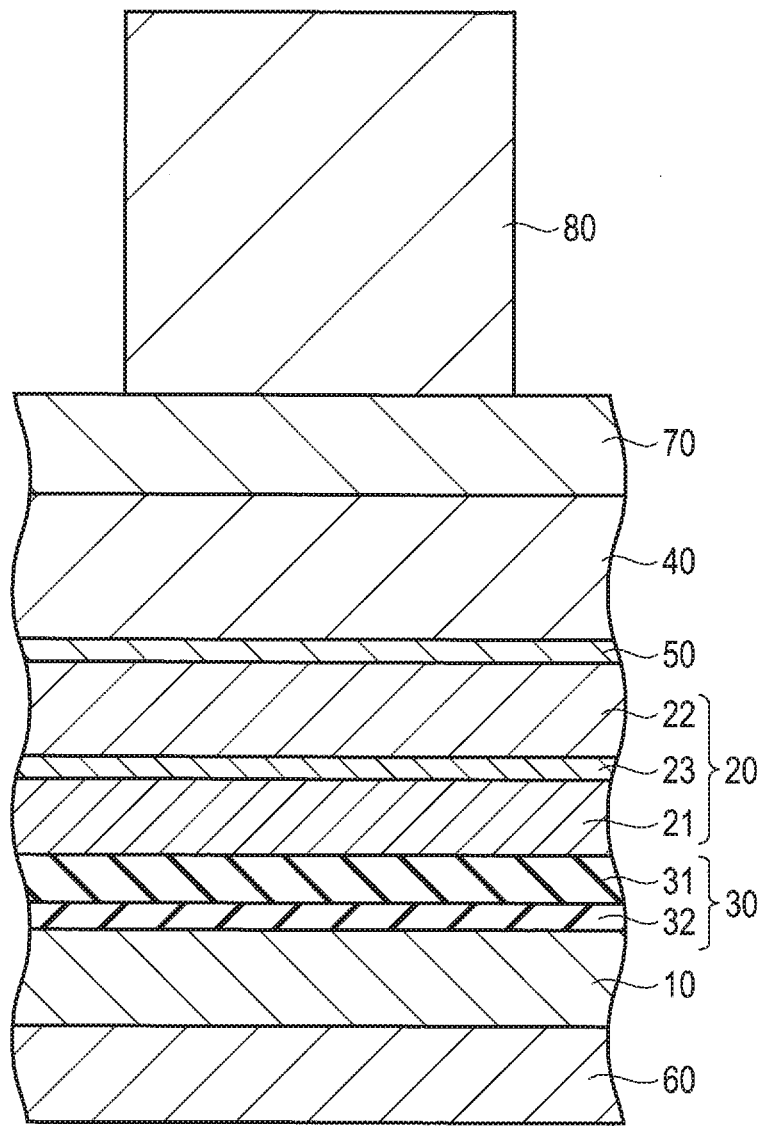
FIG. 6 is a cross-sectional view schematically showing a part of a first manufacturing method of the magnetic memory device according to the first embodiment.

Now, this specification explains a first manufacturing method of the above magnetoresistive element (stacked structure 100) with reference to FIG. 6 and FIG. 1.

As shown in FIG. 6, the under layer 60, the storage layer 10, the tunnel barrier layer 30 (including the second oxide layer 32 and the first oxide layer 31), the reference layer 20 (including the first sub-magnetic layer 21, the intermediate layer 23 and the second sub-magnetic layer 22), the intermediate layer 50, the shift-canceling layer 40 and the cap layer 70 are stacked by sputtering etc. Subsequently, a hard mask 80 is formed on the stacked film. Subsequently, the stacked film is etched by ion beam etching (IBE) etc., using the hard mask 80 as a mask. Further, the hard mask 80 is removed. As a result, the structure shown in FIG. 1 is obtained.

Figure 7:
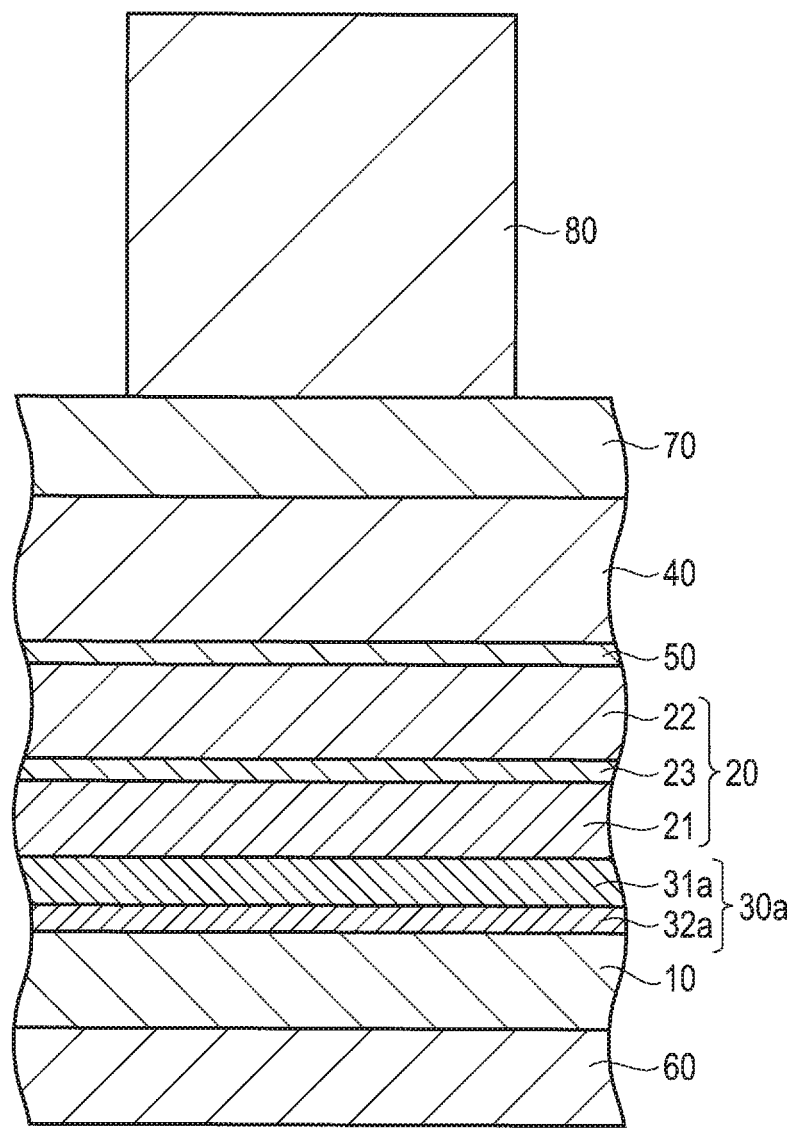
FIG. 7 is a cross-sectional view schematically showing a part of a second manufacturing method of the magnetic memory device according to the first embodiment.
Figure 8:
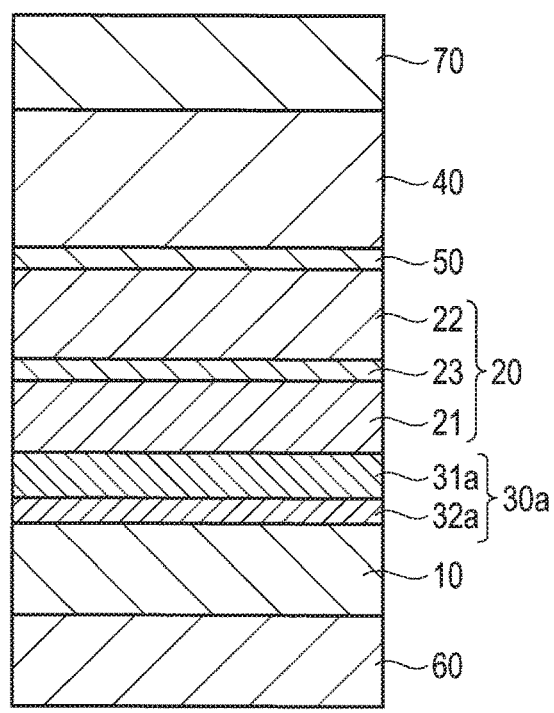
FIG. 8 is a cross-sectional view schematically showing a part of the second manufacturing method of the magnetic memory device according to the first embodiment.

Now, this specification explains a second manufacturing method of the above magnetoresistive element (stacked structure 100) with reference to FIG. 7, FIG. 8 and FIG. 1.

As shown in FIG. 7, the under layer 60, the storage layer 10, a preliminary metal layer 30a (including a second metal layer 32a and a first metal layer 31a) for forming a tunnel barrier layer (metal oxide layer), the reference layer 20 (including the first sub-magnetic layer 21, the intermediate layer 23 and the second sub-magnetic layer 22), the intermediate layer 50, the shift-canceling layer 40 and the cap layer 70 are stacked by sputtering etc. Subsequently, the hard mask 80 is formed on the stacked film. Subsequently, as shown in FIG. 8, the stacked film is etched by IBE etc., using the hard mask 80 shown in FIG. 7 as a mask. Further, when annealing is performed in an oxidative atmosphere, the metal layer 30a (including the first metal layer 31a and the second metal layer 32a) is oxidized. Thus, the structure comprising the tunnel barrier layer 30 (including the first oxide layer 31 and the second oxide layer 32) shown in FIG. 1 is obtained.

Figure 9:
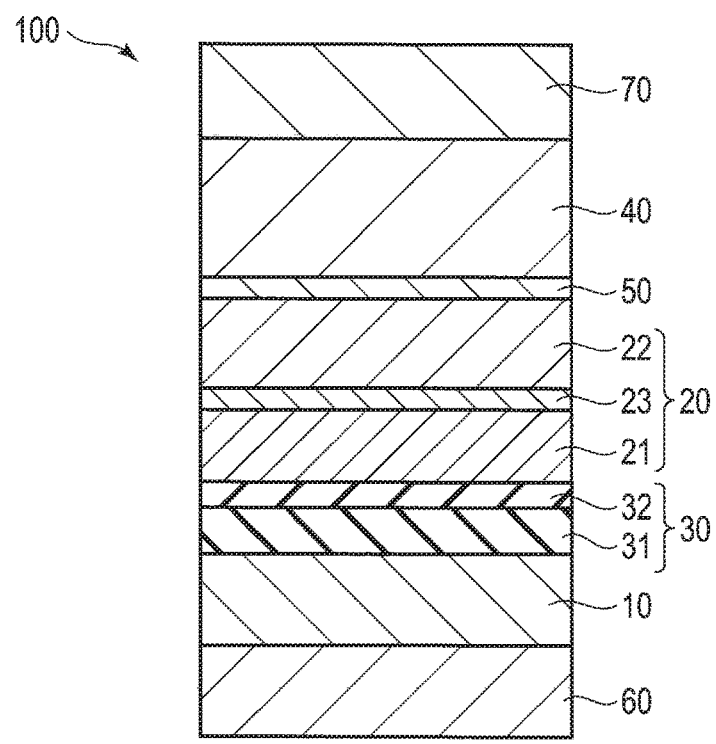
FIG. 9 is a cross-sectional view schematically showing the structure of a first modification example of the magnetic memory device according to the first embodiment.

FIG. 9 is a cross-sectional view schematically showing the structure of a first modification example of the present embodiment. In the above embodiment (FIG. 1), the first oxide layer 31 of the tunnel barrier layer 30 is in contact with the reference layer 20, and the second oxide layer 32 of the tunnel barrier layer 30 is in contact with the storage layer 10. In this modification example, the first oxide layer 31 of the tunnel barrier layer 30 is in contact with the storage layer 10, and the second oxide layer 32 of the tunnel barrier layer 30 is in contact with the reference layer 20. Even with this structure, an effect similar to that of the above embodiment can be obtained.

Figure 10:
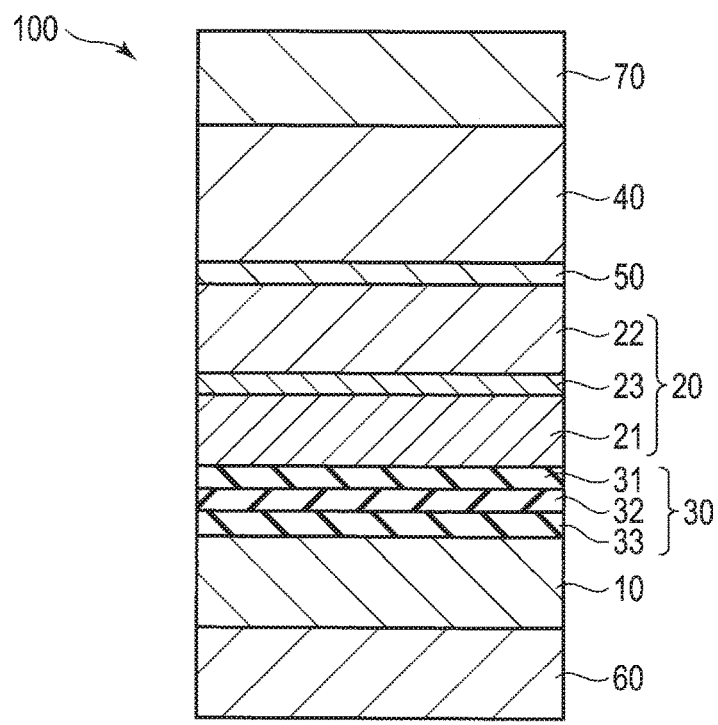
FIG. 10 is a cross-sectional view schematically showing the structure of a second modification example of the magnetic memory device according to the first embodiment.

FIG. 10 is a cross-sectional view schematically showing the structure of a second modification example of the present embodiment. In this modification example, the tunnel barrier layer 30 comprises a third oxide layer 33 in addition to the first oxide layer 31 and the second oxide layer 32. The third oxide layer 33 is formed of the first metal oxide. Thus, the third oxide layer 33 is formed of the same metal oxide as the metal oxide of the first oxide layer 31. The second oxide layer 32 is provided between the first oxide layer 31 and the third oxide layer 33. Even with this structure, an effect similar to that of the above embodiment can be obtained. However, in this case, to effectively obtain the VCMA effect, the film thickness of the third oxide layer 33 is preferably less than that of the first oxide layer 31.

Figure 11:
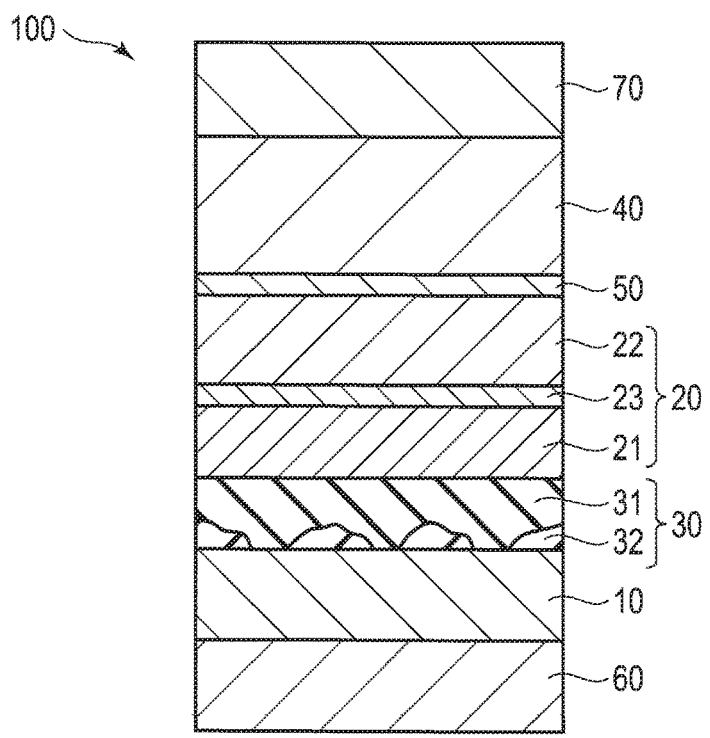
FIG. 11 is a cross-sectional view schematically showing the structure of a third modification example of the magnetic memory device according to the first embodiment.

FIG. 11 is a cross-sectional view schematically showing the structure of a third modification example of the present embodiment. In the above embodiment (FIG. 1), first modification example (FIG. 9) and second modification example (FIG. 10), each of the first and second oxide layers 31 and 32 included in the tunnel barrier layer 30 is a continuous film. However, as shown in FIG. 11, the second oxide layer 32 may be discontinuous. Even when the second oxide layer 32 is discontinuous, an effect similar to that of the above embodiment can be obtained.

Embodiment 2

Now, this specification explains a magnetic memory device according to a second embodiment. The basic matters of the present embodiment are the same as those of the first embodiment. Thus, the matters explained in the first embodiment are omitted.

Figure 12:
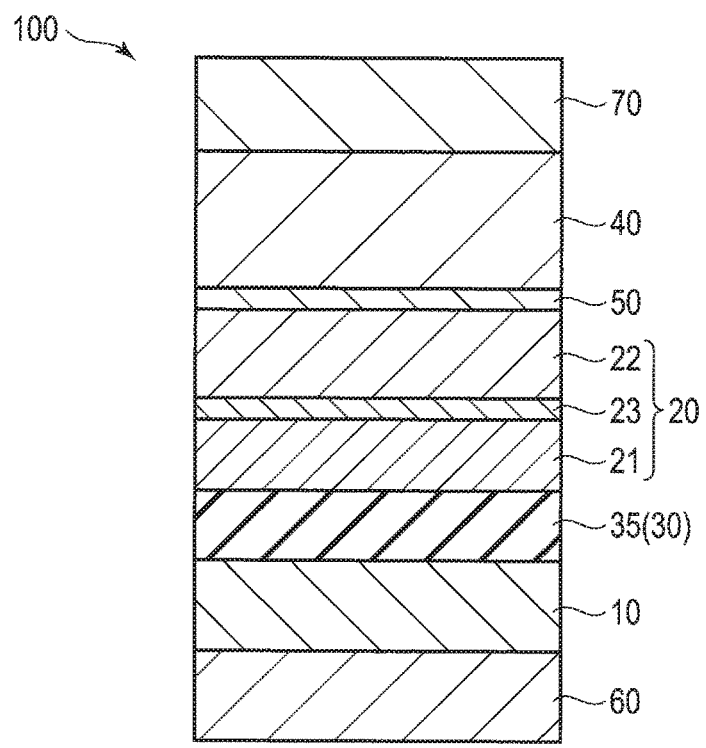
FIG. 12 is a cross-sectional view schematically showing the structure of a magnetic memory device according to a second embodiment.
Figure 13:
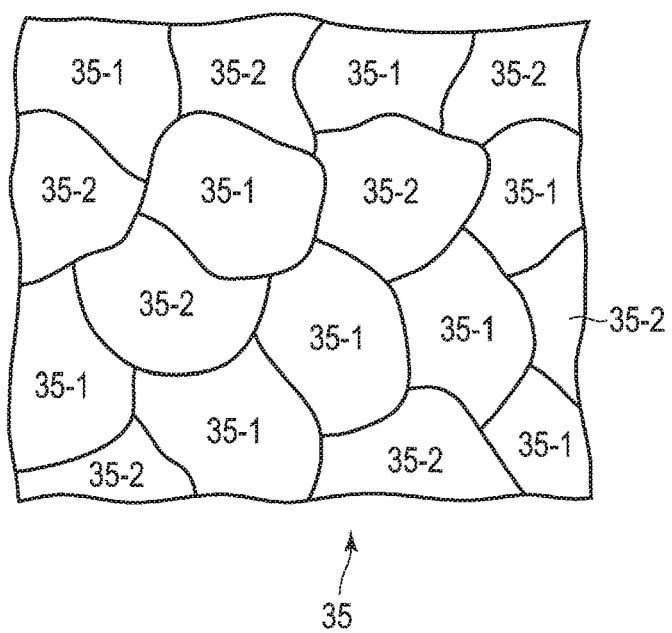
FIG. 13 is a schematic cross-sectional view in which a part of the structure shown in FIG. 12 is enlarged.

FIG. 12 is a cross-sectional view schematically showing the structure of the magnetic memory device (semiconductor integrated circuit device) according to the second embodiment. FIG. 13 is a schematic diagram in which a part of the structure shown an FIG. 12 is enlarged.

In the present embodiment, a tunnel barrier layer (nonmagnetic layer) 30 is formed as a mixed oxide layer 35 comprising a mixed structure including first areas 35-1 formed of a first metal oxide and second areas 35-2 formed of a second metal oxide. Magnesium oxide (MgO) is used for the first metal oxide. The second metal oxide has a relative dielectric constant greater than that of the first metal oxide. The second metal oxide is the same as the second metal oxide explained in the first embodiment. The molecules of the first metal oxide are contained in the first areas 35-1. The molecules of the second metal oxide are contained in the second areas 35-2. For example, when magnesium oxide (MgO) is used for the first metal oxide, and calcium oxide (CaO) is used for the second metal oxide, the first areas 35-1 are formed of MgO, and the second areas 35-2 are formed of CaO.

As described above, the tunnel barrier layer (nonmagnetic layer) 30 is formed as the mixed oxide layer 35 comprising a mixed structure including the first areas 35-1 formed of the first metal oxide and the second areas 35-2 formed of the second metal oxide. Even with this structure, an effect similar to that of the first embodiment can be obtained based on the VCMA effect.

To obtain a large TMR ratio, an area 35-1 of a magnesium oxide (MgO), which is a first metal oxide, should be large to a certain extent. An area ratio of the area 35-1 to the area 35-2 is preferably 50% or more, and more preferably 70% or more. The area ratio can be estimated not only a physical area ratio but also a composition ratio of the first metal oxide and the second metal oxide in the tunnel barrier layer (nonmagnetic layer) 30.

Embodiment 3

Now, this specification explains a magnetic memory device according to a third embodiment. The basic matters of the present embodiment are the same as those of the first embodiment. Thus, the matters explained in the first embodiment are omitted.

Figure 14:
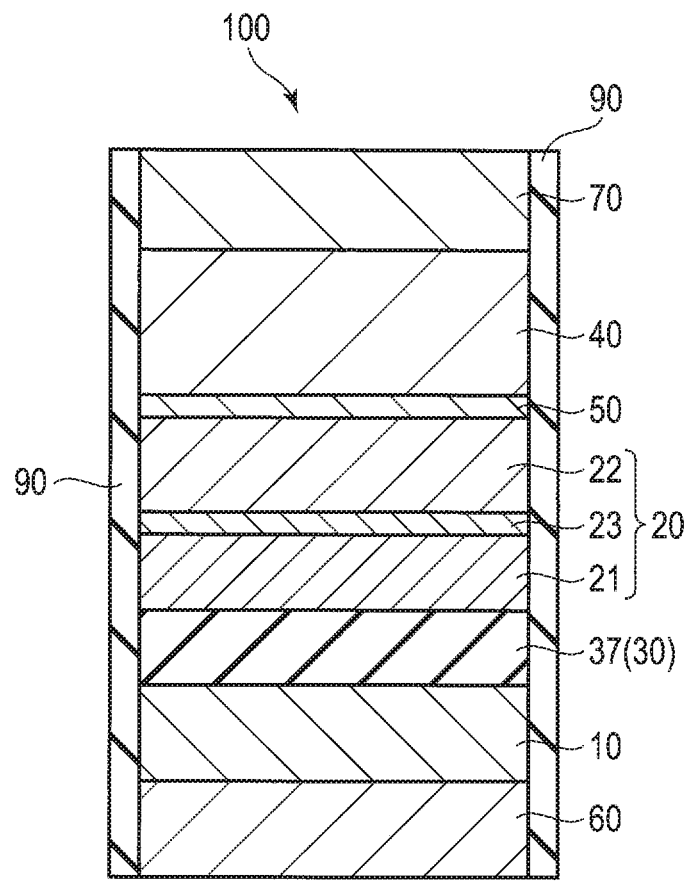
FIG. 14 is a cross-sectional view schematically showing the structure of a magnetic memory device according to a third embodiment.

FIG. 14 is a cross-sectional view schematically showing the structure of the magnetic memory device (semiconductor integrated circuit device) according to the third embodiment.

In the present embodiment, a tunnel barrier layer (nonmagnetic layer) 30 includes an oxide layer 37 formed of a first metal oxide. Further, an oxide layer (sidewall layer) 90 formed of a second metal oxide having relative dielectric constant greater than that of the first metal oxide are provided on the sidewall of a stacked structure 100. Even with this structure, an effect similar to that of the first embodiment can be obtained based on the VCMA effect. Additional explanation is provided below.

An electric field is easily concentrated on the edge (sidewall) portion of the tunnel barrier layer (nonmagnetic layer) 30. When the sidewall layer 90 formed of the second metal oxide having a high relative dielectric constant is provided on the sidewall of the stacked structure 100, the VCMA effect can be caused near the boundary between the tunnel barrier layer 30 and the sidewall layer 90. When the size of the magnetoresistive element is reduced, the proportion of the area to which the VCMA effect is caused is relatively high. As shown in FIG. 14, the tunnel barrier layer 30 is formed of the first metal oxide, and the sidewall layer 90 formed of the second metal oxide having a relative dielectric constant greater than that of the first metal oxide are formed on the sidewall of the stacked structure 100. Even with this structure, write current can be reduced by the VCMA effect.

Thus, in the present embodiment, an effect similar to that of the first embodiment can be obtained.

In the first, second and third embodiments, the VCMA effect could be caused even without complete metal oxide crystals as long as there is an oxidative tendency. In general, the bond (oxidative bond) between metal elements and oxygen can be observed by a peak shift with XPS or EELS.

Thus, when the oxidative bond between metal elements and oxygen is present, the VCMA effect could be caused.

Figure 15:
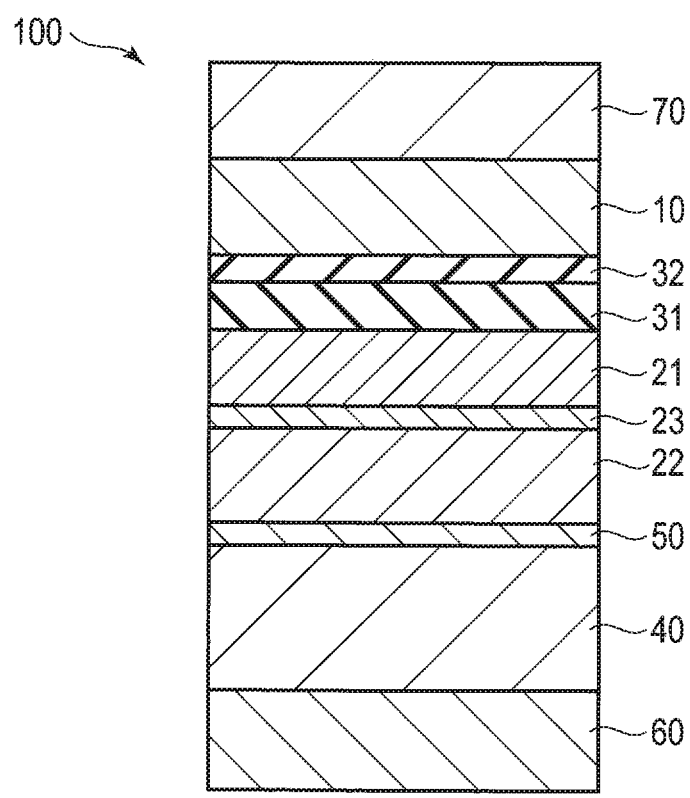
FIG. 15 is a cross-sectional view schematically showing the structure of a modification of a magnetic memory device according to a first embodiment.

In the first, second and third embodiments, the storage layer 10, the tunnel barrier layer 30 and the reference layer 20 are stacked in this order on the under layer 60. However, the order may be reversed. Specifically, as shown in FIG. 15, the reference layer 20, the tunnel barrier 30 and the storage layer 10 may be stacked in this order on the under layer 60.

The structure of the third embodiment may be combined with the structure of the first embodiment or the structure of the second embodiment.

Figure 16:
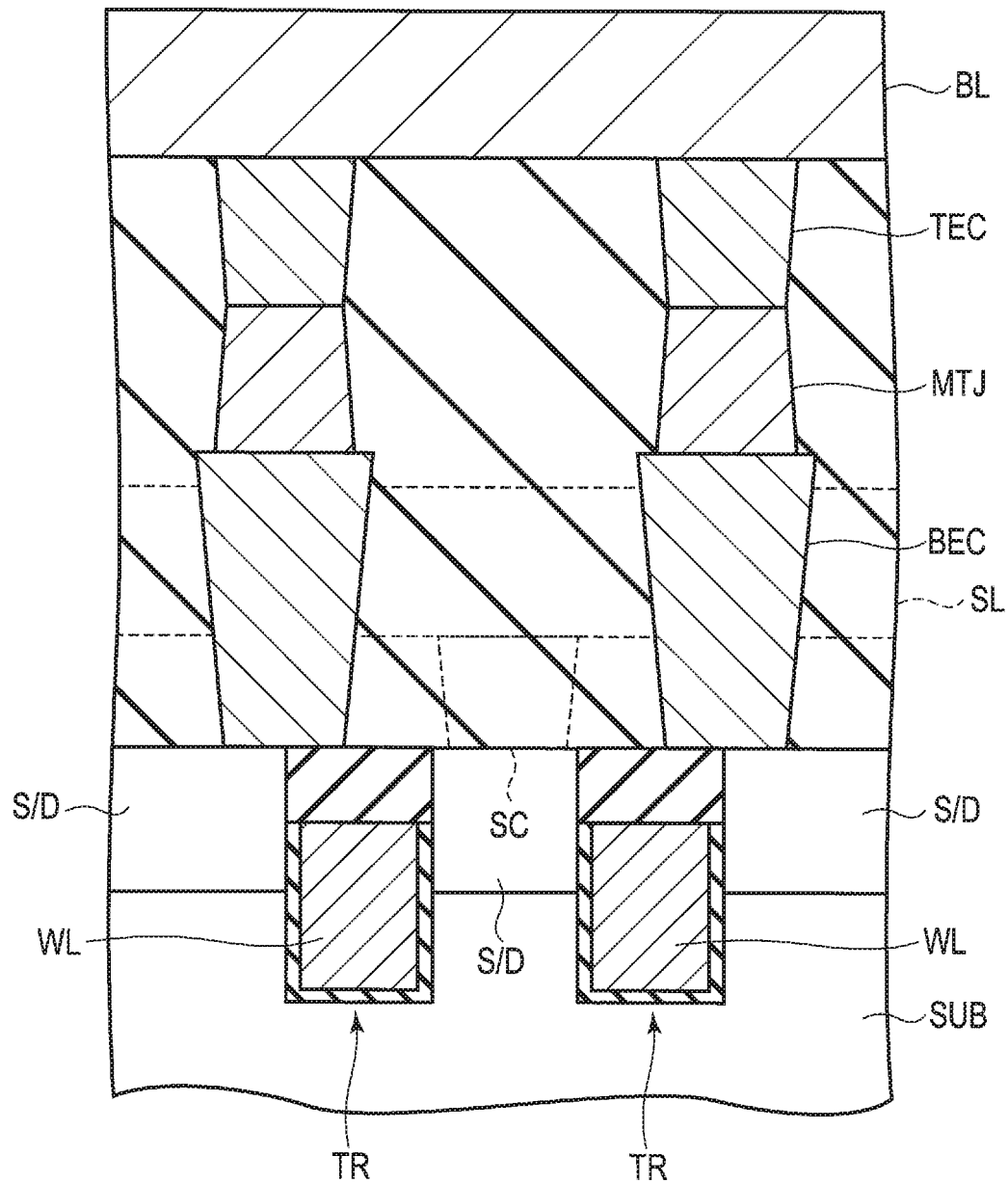
FIG. 16 is a cross-sectional view schematically showing an example of the general structure of a semiconductor integrated circuit device to which the magnetoresistive elements shown in the first, second and third embodiments are applied.

FIG. 16 is a cross-sectional view schematically showing an example of the general structure of a semiconductor integrated circuit device to which the magnetoresistive elements shown in the first, second and third embodiments are applied.

A buried-gate MOS transistor TR is formed in a semiconductor substrate SUB. The gate electrode of the MOS transistor TR is used as a word line WL. A bottom electrode BEC is connected to one of the source/drain regions S/D of the MOS transistor TR. A source line contact SC is connected to the other source/drain regions S/D.

A magnetoresistive element MTJ is formed on the bottom electrode BEC. A top electrode TEC is formed on the magnetoresistive element MTJ. A bit line BL is connected to the top electrode TEC. A source line SL is connected to the source line contact SC.

When the magnetoresistive elements explained in the first, second and third embodiments are applied to the semiconductor integrated circuit device shown in FIG. 16, the semiconductor integrated circuit device can exert an excellent effect.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic memory device comprising a stacked structure, the stacked structure including a first magnetic layer having a variable magnetization direction, a second magnetic layer having a fixed magnetization direction and a nonmagnetic layer provided between the first magnetic layer and the second magnetic layer, wherein
the nonmagnetic layer comprises a structure in which a first area formed of a first metal oxide and a second area formed of a second metal oxide having a relative dielectric constant greater than a relative dielectric constant of the first metal oxide are mixed.

2. The device of claim 1, wherein
the first metal oxide is magnesium oxide.

3. The device of claim 1, wherein
the second metal oxide is selected from the group consisting of calcium (Ca) oxide and strontium (Sr) oxide.

4. The device of claim 1, wherein
the second metal oxide is selected from the group consisting of hafnium (Hf) oxide, titanium (Ti) oxide ($TiO_2$), lanthanum (La) oxide and tantalum (Ta) oxide.

5. The device of claim 1, wherein
the second metal oxide is selected from the group consisting of europium (Eu) oxide, titanium (Ti) oxide (TiO), copper (Cu) oxide and barium (Ba) oxide.

6. The device of claim 1, wherein
the second metal oxide is selected from the group consisting of vanadium (V) oxide, nickel (Ni) oxide, cobalt (Co) oxide, manganese (Mn) oxide, chromium (Cr) oxide and iron (Fe) oxide.

* * * * *